(12) United States Patent
Kim

(10) Patent No.: US 12,721,008 B2
(45) Date of Patent: *Aug. 25, 2026

(54) DISPLAY DEVICE

(71) Applicant: LG Display Co., Ltd., Seoul (KR)

(72) Inventor: Kiwon Kim, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 305 days.

This patent is subject to a terminal disclaimer.

(21) Appl. No.: 18/489,704

(22) Filed: Oct. 18, 2023

(65) Prior Publication Data

US 2024/0147817 A1 May 2, 2024

(30) Foreign Application Priority Data

Oct. 26, 2022 (KR) ........................ 10-2022-0139498

(51) Int. Cl.
*H10K 59/80* (2023.01)

(52) U.S. Cl.
CPC ....... *H10K 59/873* (2023.02); *H10K 59/8791* (2023.02); *H10K 59/8792* (2023.02)

(58) Field of Classification Search
CPC ............... H10K 59/873; H10K 59/877; H10K 59/8722; H10K 59/8791; H10K 59/872; H10K 59/65; H10K 59/8792; G02F 1/133512
See application file for complete search history.

(56) References Cited

U.S. PATENT DOCUMENTS

| | | | | |
|---|---|---|---|---|
| 10,877,207 | B1 * | 12/2020 | Li | G02B 6/0088 |
| 11,038,004 | B2 * | 6/2021 | Kwon | H10K 59/126 |
| 11,106,066 | B2 * | 8/2021 | Inoue | G02F 1/1368 |
| 11,409,325 | B2 * | 8/2022 | Yee | G06F 1/1637 |
| 11,610,958 | B2 * | 3/2023 | Lee | H10K 59/12 |
| 2019/0324582 | A1 | 10/2019 | Lin et al. | |
| 2020/0192148 | A1 * | 6/2020 | Kim | G02F 1/133512 |
| 2020/0273934 | A1 * | 8/2020 | You | H10K 59/8722 |
| 2021/0057490 | A1 | 2/2021 | Choi et al. | |
| 2021/0286964 | A1 | 9/2021 | Lu | |
| 2022/0208915 | A1 | 6/2022 | Son | |
| 2023/0092986 | A1 | 3/2023 | Rieutort-Louis et al. | |
| 2023/0217606 | A1 * | 7/2023 | Cha | H05K 9/0067 |
| 2023/0217784 | A1 * | 7/2023 | Yu | H10K 59/8722 257/40 |
| 2025/0221283 | A1 * | 7/2025 | Choi | H10K 59/95 |

(Continued)

FOREIGN PATENT DOCUMENTS

| | | | |
|---|---|---|---|
| CN | 107340928 | A | 11/2017 |
| CN | 110032013 | A | 7/2019 |
| CN | 110658958 | A | 1/2020 |

(Continued)

*Primary Examiner* — Jarrett J Stark
(74) *Attorney, Agent, or Firm* — Seed Intellectual Property Law Group LLP

(57) ABSTRACT

A display device includes a panel including a display area and a non-display area, wherein a camera area including a first hole area is disposed in the display area; a cover glass disposed on the panel; and a plate disposed under the panel, wherein the plate includes a back plate and a metal plate, wherein each of the panel and the plate has a through-hole defined therein in the camera area, wherein black ink is disposed on an inner side surface of the through-hole of each of the panel and the plate.

20 Claims, 6 Drawing Sheets

(56) References Cited

U.S. PATENT DOCUMENTS

2025/0261543 A1* 8/2025 Kim .................... H10K 59/873

FOREIGN PATENT DOCUMENTS

| | | | |
|---|---|---|---|
| CN | 112419907 | A | 2/2021 |
| CN | 113497203 | A | 10/2021 |
| CN | 114678400 | A | 6/2022 |
| KR | 20150004255 | A | 1/2015 |
| KR | 10-2020-0039264 | A | 4/2020 |
| KR | 20200067576 | A | 6/2020 |
| KR | 20200073549 | A | 6/2020 |
| KR | 10-2021-0081953 | A | 7/2021 |
| KR | 20210085826 | A | 7/2021 |
| KR | 20210107216 | A | 9/2021 |
| KR | 102311044 | B1 | 10/2021 |

* cited by examiner

DISPLAY DEVICE

CROSS-REFERENCE TO RELATED APPLICATION

This application claims priority from Korean Patent Application No. 10-2022-0139498 filed on Oct. 26, 2022, in the Korean Intellectual Property Office, and all the benefits accruing therefrom under 35 U.S.C. 119, the contents of which in its entirety are herein incorporated by reference.

BACKGROUND

Technical Field

The present disclosure relates to a display device which may prevent light leakage and reduce static electricity related defect in a camera area disposed in a display area.

Description of the Related Art

Recent display devices capable of displaying various information and interacting with users who view the information are required to have various sizes, various shapes, and various functions.

These display devices include a liquid crystal display device (LCD), an electrophoretic display device (EPD), and an organic light-emitting display device (OLED).

The organic light-emitting display device is a self-luminous display device, and does not require a separate light source which is not the case for the LCD, and thus may be manufactured in a lightweight and thin form. Moreover, the organic light-emitting display device is not only advantageous in terms of power consumption due to low voltage operation, but also is excellent in terms of color rendering, response speed, viewing angle, and contrast ratio (CR), and thus is being studied as a next-generation display.

The organic light-emitting display device controls current flowing through an organic light-emitting diode using a plurality of thin-film transistors (TFTs) to display an image.

The display device is being developed so as to have a camera, a speaker, and a sensor added thereto.

In particular, in order to place a camera, a sensor, etc., in the display device, a hole-in-display structure in which a hole is formed in a panel of the display device is applied thereto.

BRIEF SUMMARY

When the display device operates, a light leakage phenomenon occurs in which the light from the display area leaks through a panel hole area of the panel.

Further, when a user touches a cover glass for a touch operation of the display device, static electricity may be generated in a through-hole of a camera area. This causes the quality of the display device to deteriorate.

The inventors of the present disclosure have invented a display device in which black ink as a conductive material is disposed in the through-hole of the camera area formed to receive the camera of the hole-in-display therein, thereby preventing the light leakage and the static electricity generation.

An embodiment of the present disclosure provides a display device in which black ink as a conductive material is disposed in the through-hole of the camera area formed to receive the camera therein in the display area, thereby preventing the light leakage and the static electricity generation.

Technical benefits and characteristics according to the present disclosure are not limited to those above-mentioned. Other technical benefits, characteristics according to the present disclosure that are not mentioned may be understood based on following descriptions, and may be more clearly understood based on embodiments according to the present disclosure. Further, it will be easily understood that the purposes and advantages according to the present disclosure may be realized using means shown in the embodiments or combinations thereof.

A display device according to an embodiment of the present disclosure may be provided. The display device includes a panel including a display area and a non-display area, wherein a camera area including a first hole area is disposed in the display area; a cover glass disposed on top of the panel; and a plate disposed under the panel, wherein the plate includes a back plate and a metal plate, wherein each of the panel and the plate has a through-hole defined therein in the camera area, wherein black ink is disposed on an inner side surface of the through-hole of each of the panel and the plate.

Details of other embodiments are included in the detailed descriptions and drawings.

In the display device according to the embodiment of the present disclosure, the black ink as a conductive material may be disposed in the through-hole of the camera area formed to receive the camera therein in the display area, thereby preventing the light leakage and the static electricity generation.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

The purpose, the solution, and the effect as described above do not specify the essential features of the claims. Thus, the scope of the claims is not limited by this "Summary" section.

DETAILED DESCRIPTION

Figure 1:
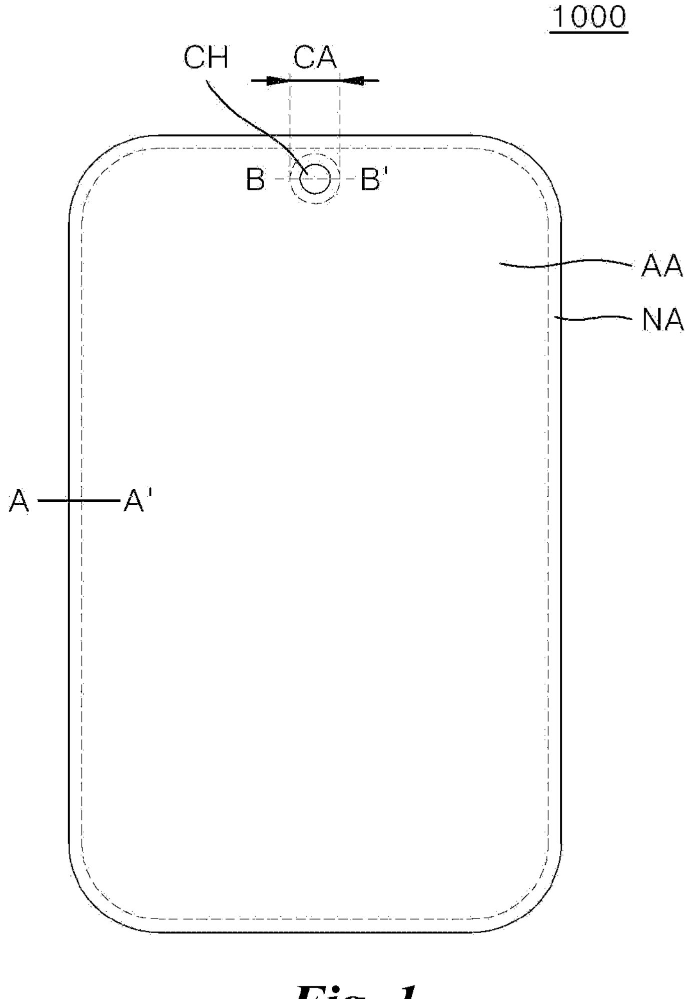
FIG. 1 is a plan view showing a display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the spirit and scope of the present disclosure.

A shape, a size, a ratio, an angle, a number, etc., disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or.' That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

In description of flow of a signal, for example, when a signal is delivered from a node A to a node B, this may include a case where the signal is transferred from the node A to the node B via another node unless a phrase 'immediately transferred' or 'directly transferred' is used.

As used herein, the term "display device" may include, in a narrow sense, a display device including a liquid crystal module (LCM), an organic light-emitting diode (OLED) module, or a quantum dot (QD) module including a display panel and a driver for driving the display panel. Moreover, the display device may include, in a broad sense, a set electronic device, a set device or a set apparatus including a complete product or a final product including the LCM, the OLED module, or the QD module such as a laptop computer, a television, a computer monitor, an automotive device or an equipment display for a vehicle.

Therefore, the display device in accordance with the present disclosure may include, in the narrow sense, a display device itself including, for example, the LCM, the OLED module, QD module, etc., and may include, in a broad sense, the set device as an application product or an end-user device including a complete product or a final product including the LCM, the OLED module, or the QD module.

Moreover, in some cases, the LCM, OLED module, or QD module composed of the display panel and the driver may be expressed as "display device" in a narrow sense. The electronic device as a complete product including the LCM, OLED module or QD module may be expressed as "set device" in a broad sense. For example, the display device in the narrow sense may include a display panel such as a liquid crystal panel, an organic light-emitting display panel, or a quantum dot display panel, and a source PCB as a controller for driving the display panel. The set device in the broad sense may include a display panel such as a liquid crystal panel, an organic light-emitting display panel, or a quantum dot display panel, a source PCB as a controller for driving the display panel, and a set PCB as a set controller that is electrically connected to the source PCB and controls the set device.

As used herein, the display panel may be of any type of the display panels such as a liquid crystal display panel, an organic light emitting diode (OLED) display panel, a quantum dot (QD) display panel, and an electroluminescent display panel, etc. Embodiments are not limited thereto. For example, the display panel may be embodied as a display panel which may be vibrated by a vibrating device according to an embodiment of the present disclosure to generate a sound. A display panel applied to a display device according to an embodiment of the present disclosure is not limited to a shape or a size of the display panel.

Hereinafter, various embodiments of the present disclosure will be described in detail with reference to drawings.

FIG. 1 is a plan view schematically showing one example of a display device according to one embodiment of the present disclosure.

A display device 1000 may include a plurality of areas. For example, the display device 1000 may include one or more display areas AA where an image is displayed, and a pixel PXL may be formed in the display area AA. One or more non-display areas NA in which an image is not displayed may include a driver circuit area and a dam area, and may be disposed on one side of the display area AA. For example, the non-display area NA may be adjacent to one or more sides of the display area AA.

Referring to FIG. 1, the non-display area NA may surround the display area AA of substantially a rectangular shape. However, it should be understood that a shape of the display area AA and a position of the non-display area NA adjacent to the display area AA are not specifically limited to those in the display device 1000 as shown in FIG. 1. Each of the display area AA and the non-display area NA may have any shape. Examples of these shapes may include a pentagon, a hexagon, a circle, an oval, etc. An embodiment of the present disclosure is not limited thereto.

In the display area AA, a plurality of pixels PXL are disposed. Each pixel PXL includes a plurality of sub-pixels. Each of the sub-pixels includes a pixel circuit.

The sub-pixels may display colors such as red (R), green (G), blue (B), and white (W). Moreover, each pixel PXL or sub-pixel may be associated with the pixel circuit including one or more transistors (thin-film transistors (TFTs)) which are disposed on a substrate of the display device 1000. Each pixel circuit may be electrically connected to a gate line and a data line to communicate with one or more driver circuits, for example, a gate driver and a data driver disposed in the non-display area NA of the display device 1000.

One or more driver circuits may be implemented as TFTs disposed in the non-display area NA as shown in FIG. 1. For example, the gate driver may be implemented using a plurality of TFTs disposed on the substrate of the display device 1000. Non-limiting examples of circuits that may be implemented as the TFTs of the substrate include an inverter circuit, a multiplexer, and an ESD (electro-static discharge) circuit. An embodiment of the present disclosure is not limited thereto.

Some driver circuits may be provided as IC (integrated circuit) chips, and may be mounted in the non-display area NA of the display device 1000 using a COG (chip-on-glass) or in other similar schemes. Moreover, some driver circuits may be mounted on another substrate, and may be coupled to a connection interface (pads/bumps, pins) disposed in the non-display area NA using a printed circuit board such as a flexible PCB (flexible printed circuit board: FPCB), COF (chip-on-film), TCP (tape-carrier-package) or other suitable schemes.

In embodiments of the present disclosure, at least two different types of TFTs are disposed in a TFT substrate for the display deice. The types of TFTs employed in a portion of the pixel circuit and a portion of the driver circuit may vary according to requirements of the display device.

For example, the pixel circuit may be implemented as a TFT (oxide TFT) with an oxide active layer. The driver circuit may be implemented as a TFT (LTPS TFT) with a low-temperature polycrystalline silicon active layer and a TFT with an oxide active layer. Unlike the LTPS TFTs, the oxide TFTs do not suffer from pixel-to-pixel threshold voltage Vth variation. A uniform threshold voltage Vth may also be obtained in an array of the pixel circuits for display. The uniformity problem of the threshold voltages Vth of the TFTs implementing the driver circuit will have less direct impact on the luminance uniformity of the pixels.

The driver circuits (for example, the gate driver) may have the gate driver IC embedded inside the display panel to reduce the number of driver ICs and to achieve cost reduction, and may provide a high-speed scan signal to the display area of the display panel.

Using the driver circuits on the substrate to be implemented as the LTPS TFTs, signals and data may be provided to pixels at a higher clock than that when all TFTs in the TFT panel are embodied as oxide TFTs. Therefore, the display device capable of high-speed operation may be realized without a stain such as mura. For example, the advantages of the oxide TFT and the LTPS TFT are combined with the design of the TFT panel such that the oxide TFT and the LTPS TFT may be selectively used according to the advantage thereof.

In the present disclosure, a panel 10 may include a substrate, and a plurality of metal layers and insulating layers disposed on the substate and constituting a display circuit for driving a display device.

The display device 1000 of the present disclosure includes a polarizer and a cover glass disposed on top of the panel and a back plate and a metal plate disposed under the panel. The display device 1000 of the present disclosure may include adhesive layers for attaching the panel and the polarizer to each other, the polarizer and the cover glass to each other, the panel and the back plate to each other, and the back plate and the metal plate to each other.

Figure 2:
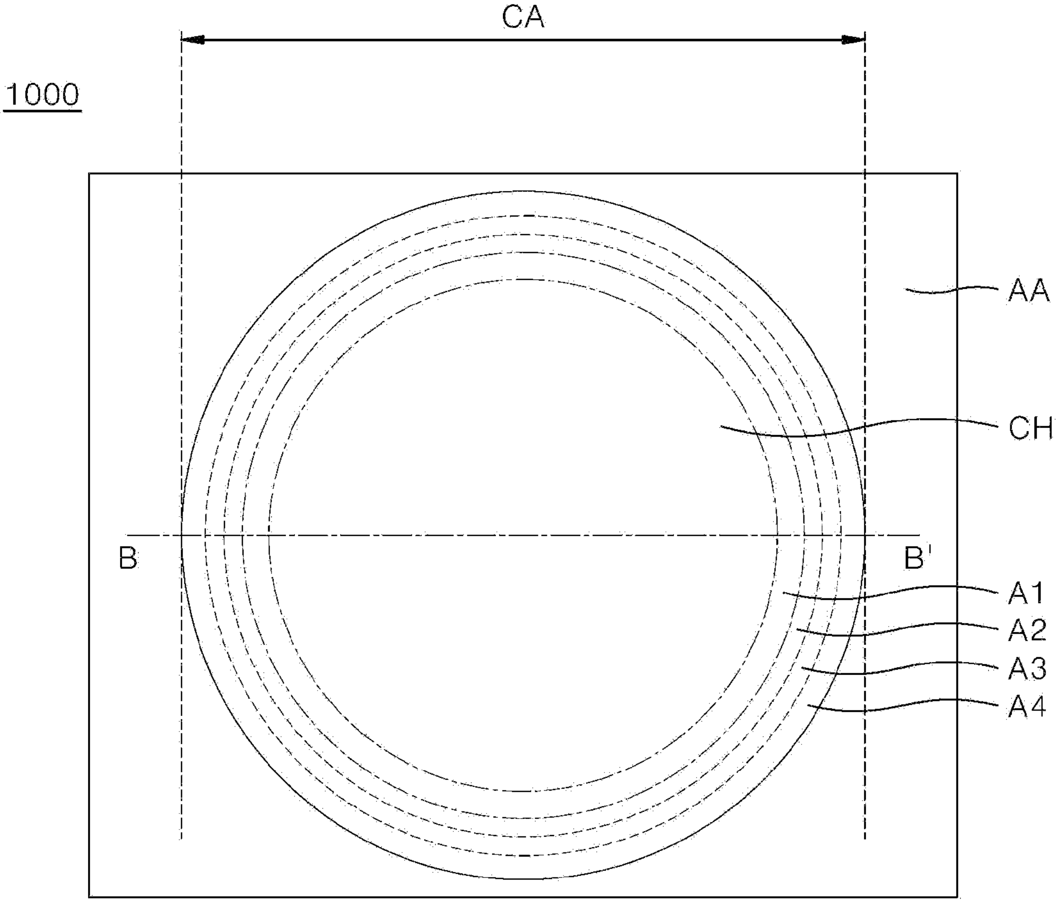
FIG. 2 is an enlarged view showing a camera area CA of FIG. 1.

FIG. 2 is an enlarged view showing a camera area CA of FIG. 1.

Referring to FIG. 2, the display area AA of the display device 1000 may include a camera area CA. The camera area CA includes a camera hole area CH to receive therein the camera, and a first area A1, a second area A2, a third area A3, and a fourth area A4 surrounding the camera hole area CH in the display area AA. These components will be described in detail later. Each of the first area A1, the second area A2, the third area A3, and the fourth area A4 may have a ring shape.

Figure 3:
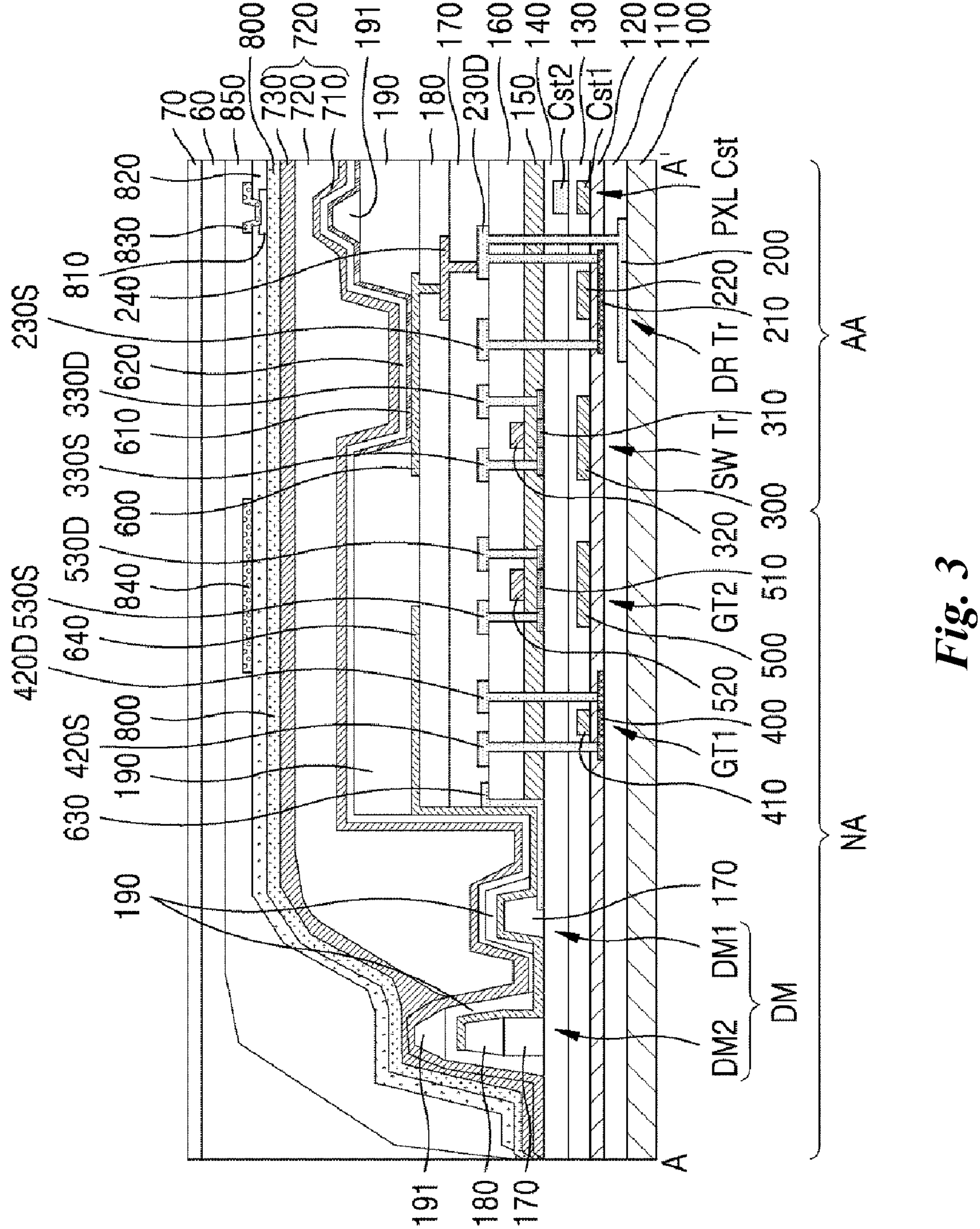
FIG. 3 is a cross-sectional view of a panel according to an embodiment of the present disclosure as taken along A-A' of FIG. 1.

FIG. 3 is a cross-sectional view of a panel according to an embodiment of the present disclosure as taken along A-A' of FIG. 1.

Referring to FIG. 3, a substrate 100 of the display device according to an embodiment of the present disclosure may include a first substrate and a second substrate, and an intermediate layer between the first substrate and the second substrate.

The first substrate and the second substrate may be made of at least one of polyimide, polyethersulfone, polyethylene terephthalate, and polycarbonate. Embodiments of the present disclosure are not limited thereto. When the substrate is made of a plastic material, a manufacturing process of the display device proceeds in a state where a support substrate made of glass is disposed under the substrate. Then, after the manufacturing process of the display device is completed, the support substrate may be released. Further, after the support substrate is released, a back plate (or a plate) to support the substrate may be disposed under the substrate. When the substrate is made of a plastic material, moisture may invade into the substrate and then into the thin-film transistor or the light-emitting element layer, which may deteriorate the performance of the display device. The display device according to an embodiment of the present disclosure may be composed of the two substrates, that is, the first substrate and the second substrate made of a plastic material in order to prevent performance degradation of the display device due to the moisture permeation. Further, the intermediate layer made of an inorganic material may be disposed between the first substrate and the second substrate so as to prevent moisture from penetrating the substrate, thereby may improve the performance reliability of the product. The intermediate layer may be composed of an inorganic film. For example, the intermediate layer may be composed of a single layer of silicon nitride (SiNx) or silicon oxide (SiOx) or a stack of multiple layers made of thereof. However, the present disclosure is not limited thereto.

The display device formed on the substrate 10 may include a plurality of areas. In the present disclosure, the plurality of areas include a display area AA and a non-display area NA. However, embodiments of the present disclosure are not limited thereto.

A buffer layer may be disposed on one surface of the substrate 100 and in the display area AA and the non-display area NA. The buffer layer may be composed of a single layer made of silicon nitride (SiNx) or silicon oxide (SiOx) or a stack of multiple layers made thereof. When the buffer layer is composed of the stack of the multiple layers, the stack may include silicon oxide layers (SiOx) and silicon nitride layers (SiNx) which may be alternately stacked on top of each other.

The buffer layer may improve adhesion between layers formed on the buffer layer and the substrate 100, and may perform a role of blocking various types of defect-causing factors, such as alkali components flowing out from the substrate 100. Further, the buffer layer may suppress diffusion of moisture or oxygen that has penetrated into the substrate 100.

The buffer layer may be omitted based on a type and a material of the substrate, a structure and a type of the thin-film transistor, and the like.

The thin-film transistors may be formed on the substrate and the buffer layer and in the display area AA and the non-display area NA. The thin-film transistors of the display area AA may include a switching transistor SW Tr and a driving transistor DR Tr for driving the sub-pixel. In addition, a pixel capacitor PXL Cst may be formed in the display area AA. The thin-film transistors of the non-display area NA may include a first gate driving transistor GT1 and a second gate driving transistor GT2 for driving a gate driver.

The driving transistor DR Tr of the display area AA may include a light-blocking layer 200 disposed on the substrate 100 or the buffer layer.

The light-blocking layer 200 may prevent light from being directed to a first semiconductor layer 210 of the driving transistor DR Tr, and may be connected to a first drain electrode 230D so as to prevent a phenomenon that parasitic carriers are accumulated in the first semiconductor layer 210, resulting in a rapid increase in drain current or to prevent a threshold voltage from changing due to this phenomenon.

The light-blocking layer 200 may be composed of a single layer or a stack of multiple layers made of at least one of titanium (Ti), molybdenum (Mo), copper (Cu), aluminum (Al), silver (Ag), chromium (Cr), gold (Au), or neodymium (Nd), nickel (Ni), or an alloy thereof. However, embodiments of the present disclosure are not limited thereto.

A first insulating layer 110 may be disposed on the light-blocking layer 200.

The first insulating layer 110 may be made of an insulating material such as silicon nitride (SiNx) or silicon oxide (SiOx), or may be made of an insulating inorganic or organic material. However, embodiments of the present disclosure are not limited thereto.

The first semiconductor layer 210 of the driving transistor DR Tr of the display area AA and a second semiconductor layer 400 of the first gate driving transistor GT1 of the non-display area NA may be disposed on the first insulating layer 110. The first semiconductor layer 210 may vertically overlap the light-blocking layer 200.

Each of the first semiconductor layer 210 and the second semiconductor layer 400 may be made of a metal oxide semiconductor, for example, one of IGZO (Indium-gallium-zinc-oxide), IZO (Indium-zinc-oxide), IGTO (Indium-gallium-tin-oxide) and IGO (Indium-gallium-oxide). However, the present disclosure is not limited thereto.

The metal oxide semiconductor may include a channel area in which a channel along which electrons or holes move is formed, and a source area and a drain area as conductive areas respectively disposed on both opposing sides of the channel area.

The source area and the drain area may have improved conductivity via, for example, a doping process that implants impurities therein. During an etching process for forming a gate electrode on the metal oxide semiconductor, oxygen in an area of the metal oxide semiconductor that does not overlap with the gate electrode is released such that the conductivity thereof increases and thus the source area and the drain area may become conductive. A source electrode and a drain electrode may be connected to the source area and the drain area, respectively.

A first gate insulating layer 120 may be disposed on the first semiconductor layer 210 and the second semiconductor layer 400. The first gate insulating layer 120 may be made of an insulating material such as silicon nitride (SiNx) or silicon oxide (SiOx), or may be made of an insulating inorganic or organic material. However, embodiments of the present disclosure are not limited thereto.

A first gate electrode 220 and a second gate electrode 410 may be disposed on the first gate insulating layer 120 so as to vertically overlap the first semiconductor layer 210 and the second semiconductor layer 400, respectively. Each of the first gate electrode 220 and the second gate electrode 410 may be composed of a single layer or a stack of multiple layers made of any one of silver (Ag), molybdenum (Mo), copper (Cu), titanium (Ti), aluminum (Al), chromium (Cr), nickel (Ni), neodymium (Nd), tungsten (W), and gold (Au) or an alloy thereof. However, the present disclosure is not limited thereto.

A first capacitor electrode Cst1 of the pixel capacitor PXL Cst included in the sub-pixel, a first metal layer 300 vertically overlapping the switching transistor SW Tr of the sub-pixel, and a second metal layer 500 vertically overlapping the second gate driving transistor GT2 may be disposed on the first gate insulating layer 120. The first gate electrode 220 and the second gate electrode 410 may be formed in the same process.

The first metal layer 300 and the second metal layer 500 may act as lower gate electrodes of the switching transistor SW Tr and the second gate driving transistor GT2, respectively. Alternatively, the first metal layer 300 and the second metal layer 500 may act as light blocking layers that prevent light from being incident to a third semiconductor layer 310 and a fourth semiconductor layer 510 of the switching transistor SW Tr and the second gate driving transistor GT2, respectively. However, embodiments of the present disclosure are not limited thereto.

A second insulating layer 130 may be disposed on the first gate electrode 220, the second gate electrode 410, the first metal layer 300, the second metal layer 500, and the first capacitor electrode Cst1.

The second insulating layer 130 may be made of an insulating inorganic material such as silicon nitride (SiNx) or silicon oxide (SiOx), or may be made of an insulating organic material, etc. However, the present disclosure is not limited thereto.

A second capacitor electrode Cst2 of the pixel capacitor PXL Cst may be disposed on the second insulating layer 130. The second capacitor electrode Cst2 may vertically overlap with the first capacitor electrode Cst1 and may be made of the same material as that of the first capacitor electrode Cst1.

A third insulating layer 140 may be disposed on the second capacitor electrode Cst2.

The third insulating layer 140 may be made of an insulating inorganic material such as silicon nitride (SiNx) or silicon oxide (SiOx), or may be made of an insulating organic material, etc. However, the present disclosure is not limited thereto.

The third semiconductor layer 310 of the switching transistor SW Tr of the display area AA and the fourth semiconductor layer 510 of the second gate driving transistor GT2 of the non-display area NA may be disposed on the third insulating layer 140.

Each of the third semiconductor layer 310 and the fourth semiconductor layer 510 may be made of LTPS (Low Temperature Polycrystalline Silicon).

A second gate insulating layer 150 may be disposed on the third semiconductor layer 310 and the fourth semiconductor layer 510. A third gate electrode 320 and a fourth gate electrode 520 may be disposed on the second gate insulating layer 150. The second gate insulating layer 150 may be disposed between the third semiconductor layer 310 and the third gate electrode 320 and between the fourth semiconductor layer 510 and the fourth gate electrode 520 so as to electrically insulate the third semiconductor layer 310 and the fourth semiconductor layer 510 from the third gate electrode 320 and the fourth gate electrode 520, respectively.

A channel area and source/drain areas respectively connected to source/drain electrodes may be formed in each of the third semiconductor layer 310 and the fourth semiconductor layer 510 as the LPTS semiconductor layer via a doping process thereof.

The second gate insulating layer 150 may be made of an insulating inorganic material such as silicon nitride (SiNx) or silicon oxide (SiOx), or may be made of an insulating organic material, etc. However, the present disclosure is not limited thereto.

The third gate electrode 320 and the fourth gate electrode 520 may be disposed so as to vertically overlap the third semiconductor layer 310 and the fourth semiconductor layer 510, respectively.

Each of the third gate electrode 320 and the fourth gate electrode 520 may be composed of a single layer or a stack of multiple layers made of any one of silver (Ag), molybdenum (Mo), copper (Cu), titanium (Ti), aluminum (Al), chromium (Cr), nickel (Ni), neodymium (Nd), tungsten (W), and gold (Au) or an alloy thereof. However, the present disclosure is not limited thereto.

A fourth insulating layer 160 may be disposed on the third gate electrode 320 and the fourth gate electrode 520.

The fourth insulating layer 160 may be made of an insulating inorganic material such as silicon nitride (SiNx) or silicon oxide (SiOx). Alternatively, the fourth insulating layer 160 may be made of at least one organic insulating material selected from among BCB (BenzoCycloButene), acryl resin, epoxy resin, phenolic resin, polyamide resin, and polyimide resin. However, the present disclosure is not limited thereto.

A first source electrode 230S and a first drain electrode 230D connected to the first semiconductor layer 210, a second source electrode 420S and a second drain electrode 420D connected to the second semiconductor layer 400, a third source electrode 330S and a third drain electrode 330D connected to the third semiconductor layer 310, and a fourth source electrode 530S and a fourth drain electrode 530D connected to the fourth semiconductor layer 510 may be disposed on the fourth insulating layer 160.

The first source electrode 230S and the first drain electrode 230D, and the second source electrode 420S and the second drain electrode 420D may be respectively connected to the first semiconductor layer 210 and the second semiconductor layer 400 via contact-holes formed in the first gate insulating layer 120, the second insulating layer 130, the third insulating layer 140, the second gate insulating layer 150 and the fourth insulating layer 160.

The third source electrode 330S and the third drain electrode 330D, and the fourth source electrode 530S and the fourth drain electrode 530D may be respectively connected to the third semiconductor layer 310 and the fourth semiconductor layer 510 via contact-holes formed in the second gate insulating layer 150 and the fourth insulating layer 160.

The first source electrode 230S, the first drain electrode 230D, the second source electrode 420S, the second drain electrode 420D, the third source electrode 330S, the third drain electrode 330D, the fourth source electrode 530S, and the fourth drain electrode 530D may be formed in the same process. Each of the first source electrode 230S, the first drain electrode 230D, the second source electrode 420S, the second drain electrode 420D, the third source electrode 330S, the third drain electrode 330D, the fourth source electrode 530S, and the fourth drain electrode 530D may include at least one of titanium (Ti), molybdenum (Mo), copper (Cu), aluminum (Al), silver (Ag), chromium (Cr), gold (Au), neodymium (Nd), or nickel (Ni) or may be made of an alloy thereof. However, embodiments of the present disclosure are not limited thereto.

A first line 630 may be disposed in the non-display area NA. The first line 630 may be formed in the same process as a process of forming the first source electrode 230S, the first drain electrode 230D, the second source electrode 420S, the second drain electrode 420D, the third source electrode 330S, the third drain electrode 330D, the fourth source electrode 530S, and the fourth drain electrode 530D.

The first line 630 may be a line for transmitting a voltage applied to a cathode electrode 620.

A first planarization layer 170 may be disposed on the first source electrode 230S, the first drain electrode 230D, the second source electrode 420S, the second drain electrode 420D, the third source electrode 330S, the third drain electrode 330D, the fourth source electrode 530S, and the fourth drain electrode 530D.

The first planarization layer 170 may be composed of an organic insulating film made of, for example, polyacrylate or polyimide, and may reduce a step caused by the lines and contact-holes formed thereunder. However, embodiments of the present disclosure are not limited thereto.

A connection electrode 240 for connecting the first drain electrode 230D and an anode electrode 600 to each other may be disposed on the first planarization layer 170.

The connection electrode 240 may be electrically connected to the first drain electrode 230D via a contact-hole formed in the first planarization layer 170.

The connection electrode 240 may be made of at least one of silver (Ag), molybdenum (Mo), copper (Cu), titanium (Ti), aluminum (Al), chromium (Cr), nickel (Ni), neodymium (Nd), and gold (Au).

A second planarization layer 180 may be disposed on the connection electrode 240. The second planarization layer 180 may be composed of an organic insulating layer made of, for example, polyacrylate or polyimide. However, embodiments of the present disclosure are not limited thereto.

The anode electrode 600 may be disposed on the second planarization layer 180. The anode electrode 600 may be electrically connected to the connection electrode 240 via a through-hole formed in the second planarization layer 180.

A second line 640 may be disposed in the non-display area NA and may be formed in the same process as a process of forming the anode electrode 600. The second line 640 may be disposed so as to vertically overlap a portion of each of the first gate driving transistor GT1 and the second gate driving transistor GT2. The second line 640 may be connected to the first line 630 disposed in the non-display area NA so as to apply a voltage to the cathode electrode 620.

Each of the anode electrode 600 and the second line 640 may be made of at least one or more of silver (Ag), aluminum (Al), gold (Au), molybdenum (Mo), tungsten (W), chromium (Cr), lead (Pd), an alloy thereof, indium tin oxide (ITO), indium zinc oxide (IZO). However, embodiments of the present disclosure are not limited thereto.

A bank 190 may be disposed on the anode electrode 600, the second line 640, and the second planarization layer 180.

The bank 190 may distinguish a plurality of sub-pixels from each other, reduce light blurring, and prevent color mixing occurring at various viewing angles.

The bank 190 may have an opening defined therein exposing a portion of the anode electrode 600 corresponding to a light-emitting area and may overlap a side end of the anode electrode 600.

The bank 190 may be made of an inorganic insulating material such as silicon nitride (SiNx) or silicon oxide (SiOx), or may be made of at least one organic insulating material selected from among BCB (BenzoCycloButene), acryl resin, epoxy resin, phenolic resin, polyamide resin, and polyimide resin. However, the present disclosure is not limited thereto.

A spacer 191 may be further disposed on the bank 190. The spacer 191 protrudes from the bank 190. The spacer 191 may support a fine metal mask (FMM) in depositing the organic light-emitting layer in the light-emitting area to prevent the bank 190 from being damaged by the fine metal mask. The spacer 191 may serve to prevent the organic light-emitting layer from being damaged by an external physical force during a subsequent manufacturing process or during use of the display device. The spacer 191 may be made of the same material as that of the bank 190. The spacer 191 and the bank 190 may be formed simultaneously. However, the present disclosure is not limited thereto.

A light-emitting element layer 610 may be disposed in the opening of the bank 190 exposing the portion of the anode electrode 600. The light-emitting element layer 600 may include at least one organic light-emitting layer selected from a red light-emitting layer, a green light-emitting layer, a blue light-emitting layer, and a white light-emitting layer in order to emit light of a specific color. The light-emitting element layer 610 may include not only the organic light-emitting layer, but also a hole injection layer, a hole transport layer, an electron transport layer, and an electron injection layer. However, the present disclosure is not limited thereto.

The hole injection layer, the hole transport layer, the electron transport layer, and the electron injection layer may be disposed in each sub-pixel and may have different thicknesses and may be made of different materials in each sub-pixel. Alternatively, each of the hole injection layer, the hole transport layer, the electron transport layer, and the electron injection layer may be commonly disposed over an entirety of the display area.

When the light-emitting element layer 610 includes the white organic light-emitting layer, the light-emitting element layer 610 may be disposed in the opening of the bank 190 and over an entire surface of the substrate.

A color filter may be disposed on the light-emitting element layer 610 so as to convert the white light emitted from the white organic light-emitting layer into light of a different color from the white color.

The cathode electrode 620 may be disposed on the light-emitting element layer 610. The cathode electrode 620 supplies electrons to the light-emitting element layer 610 and may be made of a conductive material having a low work function.

When the display device 1000 is of a top emission type, the cathode electrode 620 may be made of a transparent conductive material through which light transmits. For example, the transparent conductive material may include indium tin oxide (ITO), and indium zinc oxide (IZO). However, the present disclosure is not limited thereto.

Alternatively, the cathode electrode 6200 may be made of a semi-transmissive conductive material that transmits light therethrough. For example, the cathode electrode 620 may be made of at least one or more of LiF/Al, CsF/Al, Mg:Ag, Ca/Ag, Ca:Ag, LiF/Mg:Ag, LiF/Ca/Ag, and LiF/Ca:Ag. However, the present disclosure is not limited thereto.

When the display device 1000 is of a bottom emission type, the cathode electrode 620 may act as a reflective electrode that reflects light therefrom and may be made of an opaque conductive material. For example, the cathode electrode 620 may be made of at least one of silver (Ag), aluminum (Al), gold (Au), molybdenum (Mo), tungsten (W), chromium (Cr), or an alloy thereof.

In the non-display area NA of the display device 1000, an end area including the driver circuit area and a second dam area in which a plurality of dams are disposed is disposed.

In the end area of the non-display area NA, a connection portion in which the cathode electrode 620 and lines for applying a voltage to the cathode electrode 620 are electrically connected, and the second dam area DM may be disposed. The second dam area DM in which the plurality of dams are disposed may be an area where the display device 1000 is sealed.

The first insulating layer 110, the first gate insulating layer 120, the second insulating layer 130, and the third insulating layer 140 disposed on the substrate 100 may extend so as to be disposed in the end area of the non-display area NA.

Lines may be disposed in the end area of the non-display area NA so that a power voltage and touch signals applied from the FPCB of the display device 1000 are applied to the display panel via the lines.

The first line 630 may be partially disposed on the fourth insulating layer 160, and may contact a side surface of each of the fourth insulating layer 160 and the second gate insulating layer 150, and may extend so as to be disposed between a first dam DM1 and the third insulating layer 140 of the non-display area NA.

The first dam DM1 may be composed of a stack of a portion of the first planarization layer 170 and a portion of the bank 190.

The second dam DM2 may be composed of a stack of a portion of the first planarization layer 170, a portion of the second planarization layer 180, a portion of the bank 190, and a portion of the spacer 191.

The first dam DAM1 and the second dam DAM2 may have a first height and a second height, respectively, and may surround the display area AA.

The second dam DAM2 may be formed to have the height larger than that of the first dam DAM1. That is, the second height may be larger than the first height. Thus, even when a material of a second encapsulation layer 720 of an encapsulation 700 flows over the first dam 161, the second dam 162 may block the material of the second encapsulation layer 720.

A first encapsulation layer 710 and a third encapsulation layer 730 of the encapsulation 700 may extend outwardly beyond the second dam DM2.

The second line 640 may extend so as to be disposed between the portion of the first planarization layer 170 and the portion of the bank 190 constituting the first dam DM1 and between the portion of the second planarization layer 180 and the portion of the bank 190 constituting the second dam DM2.

The cathode electrode 620 may extend into an area between the first dam DM1 and the second dam DM2 and be electrically connected to the first line 630 and the second line 640.

The encapsulation 700 may be disposed on a portion of the cathode electrode 620 in the display area AA, and on a portion of the cathode electrode 620 and the second dam DM2 in the non-display area NA.

The encapsulation 700 may protect the display device 1000 from external moisture, oxygen, or foreign substances. For example, the encapsulation 700 may prevent penetration of oxygen and moisture from the outside into a light-emitting material and an electrode material in order to prevent oxidation of the light-emitting material and the electrode material.

The encapsulation 700 may be made of a transparent material so that light emitted from the light-emitting element layer 610 transmits therethrough.

The encapsulation 700 may include the first encapsulation layer 710, the second encapsulation layer 720, and the third encapsulation layer 730 so as to prevent penetration of moisture or oxygen into the light-emitting material and the electrode material. However, embodiments of the present disclosure are not limited thereto. The first encapsulation layer 710, the second encapsulation layer 720, and the third encapsulation layer 730 may be sequentially stacked. However, embodiments of the present disclosure are not limited thereto.

Each of the first encapsulation layer 710 and the third encapsulation layer 730 may be made of at least one inorganic material selected from among silicon nitride (SiNx), silicon oxide (SiOx), and aluminum oxide (AlyOz). However, the present disclosure is not limited thereto.

The second encapsulation layer 720 may block foreign substances or particles that may occur in the manufacturing process. Further, the second encapsulation layer 720 may planarize a surface step of the first encapsulation layer 710.

The second encapsulation layer 720 may be made of an organic material, for example, silicon oxycarbon (SiOC), epoxy, polyimide, polyethylene, or acrylate-based polymer. However, the present disclosure is not limited thereto.

A touch buffer layer 800 may be disposed on the third encapsulation layer 730. The touch buffer layer 800 may be disposed in an entirety of each of the display area AA and the non-display area NA, and may extend so as to be disposed in a pad area.

The touch buffer layer 800 may be made of at least one inorganic material selected from among silicon nitride (SiNx), silicon oxide (SiOx), and aluminum oxide (AlyOz). However, the present disclosure is not limited thereto.

A first touch electrode 810 may be disposed on the touch buffer layer 800.

A touch operation may be performed using a plurality of sensing electrodes and a plurality of driving electrodes disposed in the display area AA. Each sensing electrode may include a plurality of sub-sensing electrodes extending along a first direction and arranged so as to be spaced from each other along a second direction. The plurality of sub-sensing electrodes may be consecutively arranged in the first direction while not being disconnected from each other. The first direction and the second direction may intersect each other. For example, the first direction and the second direction may be orthogonal to each other.

Each of the plurality of driving electrodes may include a plurality of sub-driving electrodes which extend along the second direction and are arranged so as to be spaced from each other by a predefined spacing along the first direction. The plurality of sub-driving electrodes may be arranged in the second direction so as to be electrically connected to each other.

When the plurality of sub-sensing electrodes and the plurality of sub-driving electrodes are disposed in the same layer, adjacent ones of the plurality of sub-driving electrodes may be electrically connected to each other via a bridge pattern.

The plurality of sub-sensing electrodes and the plurality of sub-driving electrodes may have a metal mesh structure.

Moreover, adjacent ones of the plurality of sub-sensing electrodes may be electrically connected to each other via a bridge pattern. The plurality of sub-driving electrodes may be consecutively arranged while not being disconnected from each other so as to be electrically connected to each other.

The first touch electrode 810 may be embodied as the plurality of sub-sensing electrodes or the plurality of sub-driving electrodes.

The first touch electrode 810 may be composed of a single layer or a multilayer structure made of a metal material such as molybdenum (Mo), silver (Ag), titanium (Ti), copper (Cu), aluminum (Al), titanium/aluminum/titanium (Ti/Al/Ti), or molybdenum/aluminum/molybdenum (Mo/Al/Mo). However, the present disclosure is not limited thereto.

A touch insulating layer 820 may be disposed on the first touch electrode 810. The touch insulating layer 820 may be disposed in an entirety of each of the display area AA and the non-display area NA, and may extend so as to be disposed in the pad area. The touch insulating layer 820 may be a second insulating layer. However, the present disclosure is not limited to the term.

The touch insulating layer 820 may be made of at least one inorganic material selected from among silicon nitride (SiNx), silicon oxide (SiOx), and aluminum oxide (AlyOz). However, the present disclosure is not limited thereto.

A second touch electrode 830 may be disposed on the touch insulating layer 820. The second touch electrode 830 may be embodied as the plurality of sub-sensing electrodes or the plurality of sub-driving electrodes for the touch operation.

A touch line 840 for transmitting a touch driving signal to the non-display area NA may be disposed in the same process in a process which the second touch electrode 830 is formed.

The touch line 840 may overlap the first gate driving transistor GT1 or the second gate driving transistor GT2 and may extend so as to be disposed in the pad area.

Each of the second touch electrode 830 and the touch line 840 may be composed of a single layer or a multilayer structure made of a metal material such as molybdenum (Mo), silver (Ag), titanium (Ti), copper (Cu), aluminum (Al), titanium/aluminum/titanium (Ti/Al/Ti), or molybdenum/aluminum/molybdenum (Mo/Al/Mo). However, the present disclosure is not limited thereto.

A third planarization layer 850 may be disposed on the second touch electrode 830 and the touch line 840.

The third planarization layer 850 may cover and planarize the second touch electrode 830, the touch line 840, and the touch insulating layer 820. Further, the third planarization layer 850 may be made of at least one organic insulating material selected from among BCB (BenzoCycloButene), acryl resin, epoxy resin, phenolic resin, polyamide resin, and polyimide resin. However, the present disclosure is not limited thereto.

An adhesive layer 60 and a cover window 70 may be disposed on the third planarization layer 850.

Figure 4:
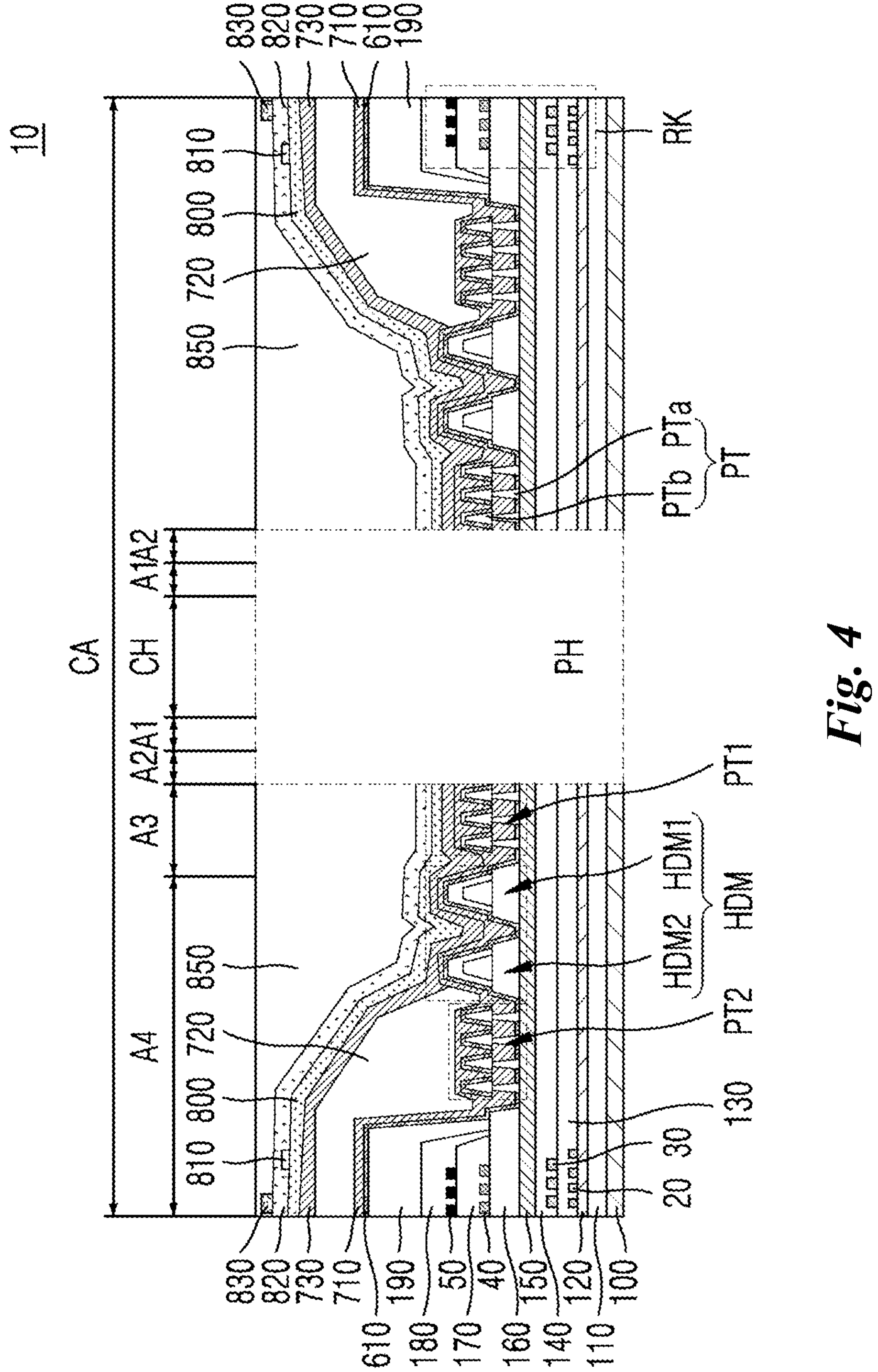
FIG. 4 is a cross-sectional view of a panel according to an embodiment of the present disclosure as taken along B-B' of FIG. 1.

FIG. 4 is a cross-sectional view of a panel according to an embodiment of the present disclosure as taken along B-B' of FIG. 1.

Referring to FIG. 4, the camera area CA of the panel is described in detail.

The camera area CA may be disposed in the display area AA and may include a panel hole area PH for receiving a camera therein, and a first pattern area PT1, a first dam area HDM, a second pattern area PT2, and a routing line area RK surrounding the panel hole area PH.

The panel hole area PH may be positioned at a center of the camera area CA, and may be formed to have a through-hole physically penetrating from the substrate 100 to the third planarization layer 850. A camera, a sensor, and a light source may be received in the panel hole area PH. Light can be easily transmitted to a top of the camera or the sensor by the panel hole area PH.

In the routing line area RK, routing lines for electrically connecting the sub-pixels of the display area AA to each other in the camera area CA are disposed.

A first routing line 20 may be disposed on a portion of the first gate insulating layer 120 extending so as to be disposed in the camera area CA. The first routing line 20 may be formed in the same process as a process of forming the first gate electrode 220, the second gate electrode 410, the first metal layer 300, the second metal layer 500, and the first capacitor electrode Cst1. However, embodiments of the present disclosure are not limited thereto.

A second routing line 30 may be disposed on a portion of the first gate insulating layer 120 extending so as to be disposed in the camera area CA, and may be formed in the same process as a process of forming the second capacitor electrode Cst2. However, embodiments of the present disclosure are not limited thereto.

A third routing line 40 may be disposed on a portion of the fourth gate insulating layer 160 extending so as to be disposed in the camera area CA. The third routing line 40 may be formed in the same process as a process of forming the first source electrode 230S, the first drain electrode 230D, the second source electrode 420S, the second drain electrode 420D, the third source electrode 330S, the third drain electrode 330D, the fourth source electrode 530S, and the fourth drain electrode 530D. However, embodiments of the present disclosure are not limited thereto.

A fourth routing line 50 may be disposed on a portion of the first planarization layer 170 extending so as to be disposed in the camera area CA and may be formed in the same process as a process of forming the connection electrode 240. However, embodiments of the present disclosure are not limited thereto.

In the routing line area RK, the first touch electrode 810 and the second touch electrode 830 may be disposed and may act as routing lines to electrically transmit the touch driving signal of the display area AA.

Gate lines of the pixel circuit of the display area AA may be connected to the first routing line 20 and the second routing line 30 and thus may be not electrically disconnected in the camera area CA. Data lines of the pixel circuit of the display area AA may be connected to the third routing line 40 and the fourth routing line 50 and thus may be not electrically disconnected in the camera area CA.

Each of the first pattern area PT1 and the second pattern area PT2 is disposed to surround the panel hole area PH. Each of the first pattern area PT1 and the second pattern area PT2 may include a plurality of patterns PT. Each of the plurality of patterns PT may be composed of a lower pattern PTa and an upper pattern PTb. The lower pattern PTa may be made of the same material as that of the fourth insulating layer 160. The lower pattern PTa and the fourth insulating layer 160 may be formed in the same process. The upper pattern PTb and the second planarization layer 180 may be made of the same material and may be formed in the same process. However, a material and the number of layers of an insulating layer of each of the plurality of patterns PT are not limited thereto.

Further, the plurality of patterns PT may be arranged to be spaced apart from each other by a predefined distance.

The plurality of patterns PT may disconnect the light-emitting element layer 610 extending from the display area AA so as to prevent moisture from flowing into the display area AA through the light-emitting element layer 610 which is vulnerable to moisture penetration.

A width of a lower surface of the upper pattern PTb disposed on the lower pattern PTa is larger than a width of an upper surface of the lower pattern PTa.

The light-emitting element layer 610 may be disposed on upper and side surfaces of the upper pattern PTb, while the light-emitting element layer 610 may not be disposed on a side surface of the lower pattern PTa due to a separation space between the lower surface of the upper pattern PTb and the side surface of the lower pattern PTa. Thus, the plurality of patterns PT may disconnect the light-emitting element layer 610.

Further, the first encapsulation layer 710 may be disposed on the routing line area RK, the first pattern area PT1, the first dam area HDM, and the second pattern area PT2 in the camera area CA.

The first hole dam HDM1 and the second hole dam HDM2 may be disposed in a first dam area HDM between the first pattern area PT1 and the second pattern area PT2.

The first hole dam HDM1 and the second hole dam HDM2 may prevent the material of the second encapsulation layer 720 from overflowing into the panel hole area PH. A plurality of first hole dams HDM1 may be consecutively arranged. A plurality of second hole dams HDM2 may be consecutively arranged. The first hole dam HDM1 and the second hole dam HDM2 may be disposed in each of the first pattern area PT1 and the second pattern area PT2.

Each of the first hole dam HDM1 and the second hole dam HDM2 may be made of the same material as a material of each of the fourth insulating layer 160, the second planarization layer 180, and the bank 190. Thus, each of the first hole dam HDM1 and the second hole dam HDM2 may be composed of a stack of a portion of the fourth insulating layer 160, a portion of the second planarization layer 180, and a portion of the bank 190. However, embodiments of the present disclosure are not limited thereto.

Due to the presence of the first hole dam HDM1 and the second hole dam HDM2, the second encapsulation layer 720 may be disposed on the second pattern area PT2 and a portion of the first dam area HDM.

The third encapsulation layer 730 may be disposed on the routing line area RK, the first pattern area PT1, the first dam area HDM, and the second pattern area PT2 in the camera area CA. The third encapsulation layer 730 may contact the first encapsulation layer 710 on the upper surface and the side surface of each of the plurality of patterns PT of the first pattern area PT1.

The touch buffer layer 800, the touch insulating layer 820, and the third planarization layer 850 may be disposed on the routing line area RK, the first pattern area PT1, the first dam area HDM, and the second pattern area PT2 in the camera area CA and may extend so as to be disposed on the third encapsulation layer 730.

The panel hole area PH may overlap the camera hole area CH, the first area A1 and the second area A2 in the camera area CA.

The third area A3 of the camera area CA may overlap the first pattern area PT1, while the fourth area A4 thereof may overlap the first dam area HDM, the second pattern area PT2, and the routing line area RK.

Figure 5:
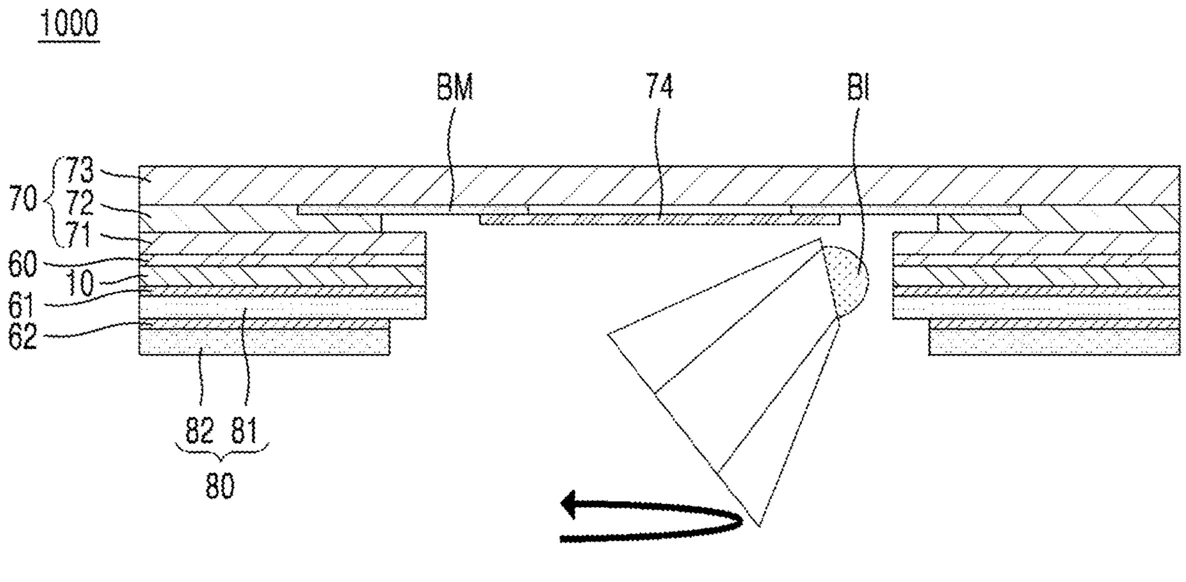
FIG. 5 is a cross-sectional view of a display device according to an embodiment of the present disclosure as taken along B-B' of FIG. 1.
Figure 6:
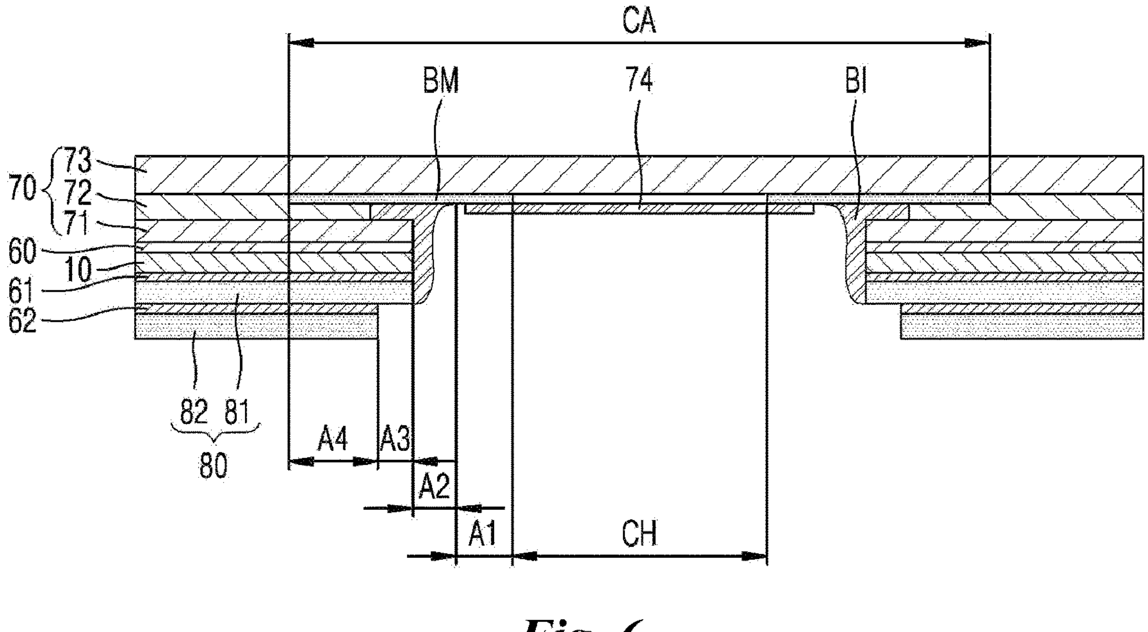
FIG. 6 is a cross-sectional view of a display device according to an embodiment of the present disclosure as taken along B-B' of FIG. 1.

Referring to FIG. 5 and FIG. 6, a cover glass 73 is disposed on top of the panel 10, while a plate 80 including a back plate 81 and a metal plate 82 is disposed under the panel 10.

Each of the panel 10 and the plate 80 may have a through-hole defined therein in the camera area CA. Black ink BI may be positioned on an inner side surface of the through-hole of the panel 10 and the plate 80.

The black ink BI may include a conductive material. The conductive material may be black carbon or silver (Ag), and may be contained at a content of 1 to 20% by weight based on a total weight of the black ink BI.

A polarizer 71 is attached to the panel 10 using a first adhesive layer 60. A cover adhesive layer 72 may be disposed between the polarizer 71 and the cover glass 73 such that the polarizer 71 and the panel 10 may be attached to the cover glass 73 via the cover adhesive layer 72.

Each of the polarizer 71, the first adhesive layer 60 and the cover adhesive layer 72 may have a through-hole defined therein in the camera area CA.

The cover adhesive layer 72 may be made of an acryl-based transparent adhesive material. The cover adhesive layer 72 contracts and expands depending on the temperature, and thus the cover adhesive layer 72 may be deformed based on the temperature. In order to prevent the cover adhesive layer 72 from being deformed to expand into the panel hole area PH of the panel 10, a diameter of the through-hole of the cover adhesive layer 72 may be larger than that of the through-hole of each of the polarizer 71 and the first adhesive layer 60.

A black matrix BM may be formed on a lower surface of the cover glass 73 and in a portion of the camera area CA except for the camera hole area CH. The black matrix BM may be formed through a coating process and a photo process. A boundary of the camera hole area CH may be defined by an inner side end of the black matrix BM. A boundary of the camera area CA may be defined by an outer side end of the black matrix BM.

A protective film 74 for protecting the cover glass 73 may be disposed in the camera hole area CH of the cover glass 73.

The panel 10 and the back plate 81 may be attached to each other using a second adhesive layer 61. The back plate 81 and the metal plate 82 may be attached to each other using a third adhesive layer 62.

A diameter of the through-hole of the metal plate 82 may be larger than that of the through-hole of the back plate 81.

The panel 10, the polarizer 71, and the back plate 81 are attached to each other using the first adhesive layer 60 and the second adhesive layer 61 to form a stack. Then, the through-hole is first defined in the stack. At this time, the through-holes of the panel 10, the polarizer 71, and the back plate 81 may have the same size.

The cover glass 73 may be attached to the polarizer 71 using the cover adhesive layer 72. The metal plate 82 to which the third adhesive layer 62 is attached may be attached to a lower surface of the back plate 81 using the third adhesive layer 62.

After the through-hole is formed, the metal plate 82 and the third adhesive layer 62 are attached to the lower surface of the back plate 81. In this regard, a width or diameter of the through-hole of the back plate 81 may be different from that of the through-hole of each of the metal plate 82 and the third adhesive layer 62.

A dimeter of each of the through-hole of the metal plate 82 and the third adhesive layer 62 may be larger than that of the through-hole of the back plate 81.

After the metal plate 82 is attached to the back plate 81, the black ink BI may be formed in the through-hole.

The black ink BI may be applied on an inner side surface of the through-hole while the black ink BI may be spaced apart, by a predefined distance, from the camera hole area CH in the camera area CA.

The black ink BI may be applied to the side inner surface of the through-hole of each of the panel 10, the first adhesive layer 60, the polarizer 71, and the cover adhesive layer 72.

The through-hole of the cover adhesive layer 72 is larger than the through-hole of each of the polarizer 71 and the first adhesive layer 60. Thus, the black ink BI may be further formed on the upper surface of the polarizer 71 by a difference between the size of the through-hole of the cover adhesive layer 72 and the size of the through-hole of each of the polarizer 71 and the first adhesive layer 60.

Further, the through-hole of each of the metal plate 82 and the third adhesive layer 62 may be larger than the through-hole of the back plate 81.

As shown in FIG. 5, while a cylinder device rotates, the cylinder device may apply the black ink BI to the inner side surface of the through-hole of the camera area CA in the display device 1000 in which the cover window 70 and the plate 80 are attached to the panel 10.

Alternatively, the display device 1000 may be fixed to a circular application device. While the display device 1000 rotates using the circular application device, the black ink BI may be applied to the inner surface of the through-hole of the camera area CA.

The black ink BI may be made of a conductive material in which 1 to 20% by weight of black carbon or silver (Ag) based on a total weight of the black ink is mixed with ink containing black pigment or dye.

The black ink BI may have a low viscosity of 5,000 cps or lower, and may include the conductive material and thus may have a sheet resistance in a range of 1.10 E+05 Ω/sq to 1.50 E+05 Ω/sq.

The camera area CA may be divided into the first area A1, the second area A2, the third area A3, and the fourth area A4 using the black matrix BM of the cover glass 73, the panel 10, the metal plate 82, and the black ink BI.

The camera area CA may include the first area A1 from a side end of the camera hole area CH where the black matrix BM is not disposed to an inner side end of the black ink BI, the second area A2 from a side end of the first area A1 to an inner side surface of the through-hole of the panel 10, the third area A3 from a side end of the second area A2 to an inner side end of the metal plate 82, and the fourth area A4 from a side end of the third area A3 to an outer side end of the black matrix BM.

FIG. 6 is a cross-sectional view of a display device according to another embodiment of the present disclosure.

The through-hole of each of the metal plate 82 and the third adhesive layer 62 may be larger than through-hole of the back plate 81.

The black ink BI may be disposed on an inner side surface of the through-hole of the panel 10, and an inner side surface of the through-hole of the back plate 81 in the second area A2 of the camera area CA. Further, the black ink BI may fill a gap area between the polarizer 71 and the cover glass 73 as created due to a difference between the width or diameter of the through-hole of the polarizer 71 and the width or diameter of the through-hole of the cover adhesive layer 72.

Figure 7:
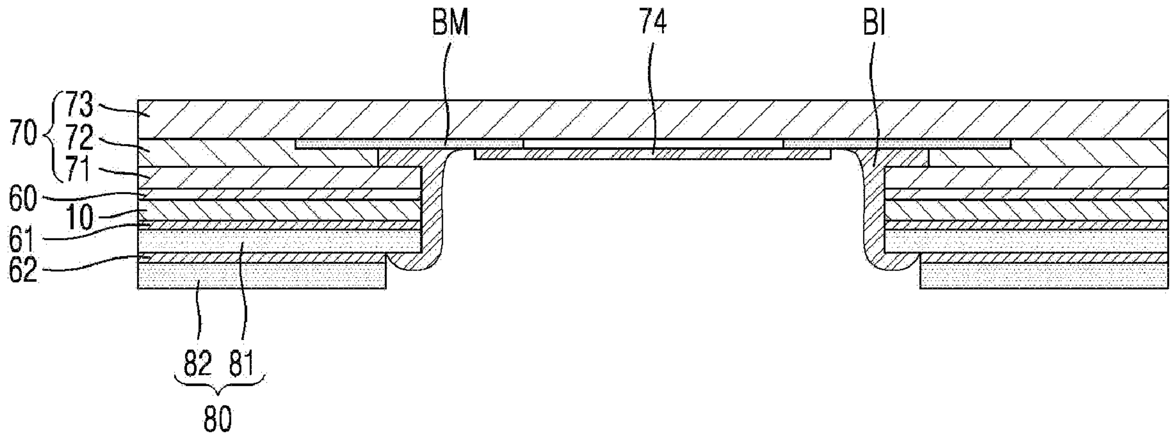
FIG. 7 is a cross-sectional view of a display device according to another embodiment of the present disclosure as taken along B-B' of FIG. 1.

FIG. 7 is a cross-sectional view of a display device according to still another embodiment of the present disclosure.

The black ink BI may be disposed in the second area A2 and the third area A3 of the camera area CA. The black ink BI may be disposed on a portion of the lower surface of the back plate 81 as well as the inner side surface of the through-hole of panel 10 and the inner side surface of the through-hole of the back plate 81.

As shown in FIG. 5, while a nozzle for applying the black ink BI is spaced apart, by a predefined distance, from the cover glass 73 so as to prevent damage to the cover glass 73, the nozzle may apply the black ink BI. A thickness of the back plate 81 may be about 80 μm. Thus, when the nozzle first applies the black ink BI on the side surface of the back plate 81, the black ink BI may not be evenly applied to the side surface of the back plate 81.

Accordingly, the black ink BI may be first applied from the portion of the lower surface of the back plate 81 such that the black ink BI is uniformly applied onto the side surface of the back plate 81.

Figure 8:
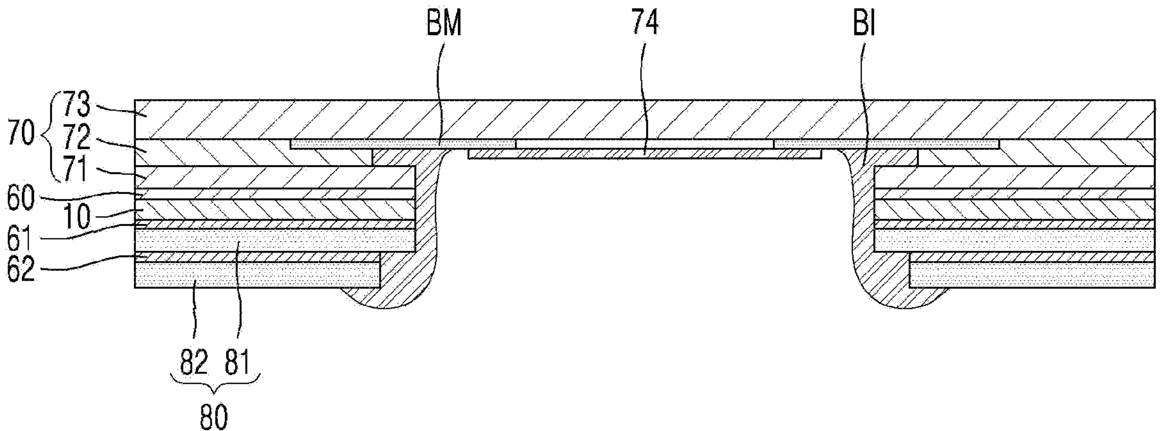
FIG. 8 is a cross-sectional view of a display device according to still another embodiment of the present disclosure as taken along B-B' of FIG. 1.

FIG. 8 is a cross-sectional view of a display device according to still yet another embodiment of the present disclosure.

The black ink BI may be disposed in the second area A2, the third area A3, and a portion of the fourth area A4 in the camera area CA.

The black ink BI may be disposed on a portion of the lower surface of metal plate 82 as well as the inner side surface of the through-hole of panel 10, the inner side surface of the through-hole of the back plate 81, and the inner side surface of the through-hole of the metal plate 82.

After attaching the metal plate 82 to the lower surface of the back plate 81, the black ink BI may be first applied onto the inner side surface of the through-hole and the portion of the lower surface of the metal plate 82.

In order to apply the black ink BI uniformly, the black ink BI may be applied onto the portion of the lower surface of the metal plate 82.

A display device according to an embodiment of the present disclosure may be described as follows.

One aspect of the present disclosure provides a display device comprising: a panel including a display area and a non-display area, wherein a camera area including a first hole area is disposed in the display area; a cover glass disposed on the panel; and a plate disposed under the panel, wherein the plate includes a back plate and a metal plate, wherein each of the panel and the plate has a through-hole defined therein in the camera area, wherein black ink is disposed on an inner side surface of the through-hole of each of the panel and the plate.

In some implementations of the display device of the present disclosure, the black ink contains a conductive material.

In some implementations of the display device of the present disclosure, the conductive material is black carbon or silver (Ag), wherein a content of the conductive material is in a range of 1 to 20% by weight based on a total weight of the black ink.

In some implementations of the display device of the present disclosure, the camera area further includes a second hole area overlapping a camera, wherein a black matrix is disposed on a lower surface of the cover glass and in a portion of the camera area other than the second hole area.

In some implementations of the display device of the present disclosure, the camera area includes: a first area from a side end of the second hole area to an inner side end of the black ink; a second area from a side end of the first area to an inner side surface of the through-hole of the panel; a third area from a side end of the second area to an inner side end of the metal plate; and a fourth area from a side end of the third area to an outer side end of the black matrix.

In some implementations of the display device of the present disclosure, the first hole area of the panel overlaps the second hole area, the first area, and the second area.

In some implementations of the display device of the present disclosure, the camera area includes: a first pattern area overlapping the third area; a first dam area overlapping a portion of the fourth area; a second pattern area overlapping another portion of the fourth area; and a routing line area overlapping still another portion of the fourth area.

In some implementations of the display device of the present disclosure, a diameter of the through-hole of the back plate and a diameter of the through-hole of the metal plate are different from each other.

In some implementations of the display device of the present disclosure, the diameter of the through-hole of the metal plate is larger than the diameter of the through-hole of the back plate.

In some implementations of the display device of the present disclosure, the black ink is disposed on an inner side surface of the through-hole of the back plate and a portion of a lower surface of the back plate.

In some implementations of the display device of the present disclosure, the black ink is disposed on an inner side surface of the through-hole of the metal plate and a portion of a lower surface of the metal plate.

In some implementations of the display device of the present disclosure, the display device further comprises: a first adhesive layer and a polarizer disposed on the panel; and a cover adhesive layer disposed between the polarizer and the cover glass.

In some implementations of the display device of the present disclosure, each of the polarizer, the first adhesive layer, and the cover adhesive layer has a through-hole defined therein in the camera area.

In some implementations of the display device of the present disclosure, the black ink is disposed on an inner side surface of the through-hole of each of the polarizer, the first adhesive layer, and the cover adhesive layer.

In some implementations of the display device of the present disclosure, a diameter of the through-hole of the cover adhesive layer is larger than a diameter of the through-hole of each of the polarizer and the first adhesive layer.

In some implementations of the display device of the present disclosure, a plurality of pixels are disposed in the display area, wherein each pixel includes sub-pixels, wherein each sub-pixel includes a pixel circuit.

In some implementations of the display device of the present disclosure, the pixel circuit includes at least one transistor, wherein each sub-pixel includes an anode electrode electrically connected to the at least one transistor, a light-emitting layer, and a cathode electrode.

In some implementations of the display device of the present disclosure, the display device further comprises an encapsulation layer and a touch electrode disposed on the cathode electrode.

In some implementations of the display device of the present disclosure, the display device further comprises a camera, a sensor, and/or a light source disposed in the camera area.

In some implementations of the display device of the present disclosure, the display device further comprises a driver circuit area and a dam area disposed in the non-display area.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a panel including a display area and a non-display area, wherein a camera area including a first hole area is disposed in the display area;

a cover glass disposed on the panel; and a plate disposed on the panel and opposite to the cover glass, wherein the plate includes a back plate and a metal plate, wherein each of the panel and the plate has a through-hole therein in a location overlapping the camera area, wherein black ink is disposed on an inner side surface of the through-hole of each of the panel and the plate.

2. The display device of claim 1, wherein the black ink contains a conductive material.

3. The display device of claim 2, wherein the conductive material is black carbon or silver (Ag), wherein a content of the conductive material is in a range of 1% to 20%, inclusive, by weight based on a total weight of the black ink.

4. The display device of claim 1, wherein the camera area further includes a second hole area overlapping a camera, wherein a black matrix is disposed on a lower surface of the cover glass and in a portion of the camera area other than the second hole area.

5. The display device of claim 4, wherein the camera area includes:

a first area from a side end of the second hole area to an inner side end of the black ink;

a second area from a side end of the first area to an inner side surface of the through-hole of the panel;

a third area from a side end of the second area to an inner side end of the metal plate; and a fourth area from a side end of the third area to an outer side end of the black matrix.

6. The display device of claim 4, wherein the first hole area of the panel overlaps the second hole area, the first area, and the second area.

7. The display device of claim 5, wherein the camera area includes:

a first pattern area overlapping the third area;

a first dam area overlapping a portion of the fourth area;

a second pattern area overlapping another portion of the fourth area; and a routing line area overlapping still another portion of the fourth area.

8. The display device of claim 1, wherein the through-hole in the plate includes a first through-hole portion in the metal plate and a second through-hole portion in the back plate, a diameter of the second through-hole portion in the back plate and a diameter of the first through-hole portion in the metal plate are different from each other.

9. The display device of claim 8, wherein the diameter of the first through-hole portion in the metal plate is larger than the diameter of the second through-hole portion in the back plate.

10. The display device of claim 9, wherein the black ink is disposed on an inner side surface of the second through-hole portion in the back plate and a portion of a lower surface of the back plate.

11. The display device of claim 9, wherein the black ink is disposed on an inner side surface of the first through-hole portion in the metal plate and a portion of a lower surface of the metal plate.

12. The display device of claim 1, further comprising:

a first adhesive layer and a polarizer disposed on the panel; and a cover adhesive layer disposed between the polarizer and the cover glass.

13. The display device of claim 12, wherein each of the polarizer, the first adhesive layer, and the cover adhesive layer has a through-hole located therein and in or overlapping the camera area.

14. The display device of claim 13, wherein the black ink is disposed on an inner side surface of the through-hole of each of the polarizer, the first adhesive layer, and the cover adhesive layer.

15. The display device of claim 14, wherein a diameter of the through-hole of the cover adhesive layer is larger than a diameter of the through-hole of each of the polarizer and the first adhesive layer.

16. The display device of claim 1, wherein a plurality of pixels are disposed in the display area, wherein each pixel includes sub-pixels, wherein each sub-pixel includes a pixel circuit.

17. The display device of claim 16, wherein the pixel circuit includes at least one transistor, wherein each sub-pixel includes an anode electrode electrically connected to the at least one transistor, a light-emitting layer, and a cathode electrode.

18. The display device of claim 17, further comprising an encapsulation layer and a touch electrode disposed on the cathode electrode.

19. The display device of claim 1, further comprising one or more of a camera, a sensor, or a light source disposed in the camera area.

20. The display device of claim 1, further comprising a driver circuit area and a dam area disposed in the non-display area.

* * * * *